United States Patent [19]

May et al.

[11] Patent Number: 5,760,728

[45] Date of Patent: Jun. 2, 1998

[54] INPUT STAGE FOR AN ANALOG-TO-DIGITAL CONVERTER AND METHOD OF OPERATION THEREOF

[75] Inventors: Michael R. May; John E. Willis, both of Austin, Tex.

[73] Assignee: Motorola, Inc., Schaumburg, Ill.

[21] Appl. No.: 794,622

[22] Filed: Feb. 3, 1997

[51] Int. Cl.$^6$ .................................................. H03M 1/00
[52] U.S. Cl. .................................................. 341/155; 341/172
[58] Field of Search ............................. 341/143, 166, 341/167, 172, 155, 120

[56] References Cited

U.S. PATENT DOCUMENTS

| | | | |
|---|---|---|---|
| 4,385,286 | 5/1983 | Haque | 340/347 |
| 4,438,354 | 3/1984 | Haque et al. | 307/493 |
| 4,498,063 | 2/1985 | Makabe et al. | 333/173 |
| 4,499,412 | 2/1985 | Locher et al. | 318/592 |
| 4,558,185 | 12/1985 | Morikawa et al. | 179/170 |
| 4,607,243 | 8/1986 | Dreier | 333/214 |
| 4,633,425 | 12/1986 | Senderowicz | 364/825 |
| 4,713,628 | 12/1987 | Nelson | 330/254 |
| 5,134,401 | 7/1992 | McCartney et al. | 341/143 |
| 5,153,593 | 10/1992 | Walden et al. | 341/143 |
| 5,331,218 | 7/1994 | Moody et al. | 307/521 |
| 5,570,091 | 10/1996 | Noro et al. | 341/161 |

*Primary Examiner*—Jeffrey A. Gaffin
*Assistant Examiner*—Peguy JeanPierre
*Attorney, Agent, or Firm*—Craig J. Yudell

[57] ABSTRACT

An input stage (200) for use in a Sigma-Delta analog-to-digital converter (300) that utilizes a frequency independent impedance (202) in parallel with a frequency dependent impedance (210, 212). An analog input signal (Vin) is concurrently passed through both impedances to a terminal of an operational amplifier (208). A feedback reference (REF) from the A/D converter (316) is also coupled to the terminal of the op amp (208) via a second frequency independent impedance (204). The frequency dependent impedance (210, 212) enables amplification of the input signal at higher frequencies to boost signal-to-noise ratio at such frequencies. Thus, the frequency dependent impedance significantly improves signal-to-noise ratio in the Sigma-Delta converter, thereby avoiding any pre-filtering of the Sigma-Delta inputs.

19 Claims, 3 Drawing Sheets

5,760,728

1

INPUT STAGE FOR AN ANALOG-TO-DIGITAL CONVERTER AND METHOD OF OPERATION THEREOF

FIELD OF THE INVENTION

The present invention relates in general to analog-to-digital converters and, more particularly, to Sigma-Delta analog-to-digital converters.

BACKGROUND OF THE INVENTION

Sigma-Delta analog-to-digital converters provide analog-to-digital (A/D) conversion with high resolution. Such converters (also known as Delta Sigma modulators) provide A/D conversion by employing a combination of over sampling techniques and noise shaping techniques.

Typical Sigma-Delta A/D converters (ADCs) are designed to perform an analog to digital conversion on a signal contained in a substantially flat power spectrum. If the same ADC is used to perform an analog to digital conversion on a signal with a substantially "low pass" power spectrum, where a large percent of the power is in the lower frequencies, the quality of the analog to digital conversion is far less than optimum in the high frequencies. For example, if a input signal having a low pass power spectrum such as that shown in FIG. 4 is input into a conventional Sigma-Delta converter, the output power spectral density (PSD) of the modulator would be as shown in FIG. 5. As can be seen in FIG. 4, the input signal has significant low-frequency components such that the PSD of the lower frequencies is much greater than the PSD of the higher frequencies. This scenario is typical of communication s channels such as twisted-pair phone lines. The noise component of the signal, however, has a roughly constant PSD across the entire frequency spectrum. As seen in FIG. 5, the output of a conventional Sigma-Delta ADC introduces increased quantization noise PSD at higher frequencies. As will be appreciated, the resulting output from the conventional modulator has a substantially reduced signal-to-noise ratio (SNR) at these higher frequencies. This will corrupt or eliminate useful information contained in those higher frequencies.

Therefore, it would be desirable to provide an ADC, and in particular a Sigma-Delta ADC, that avoids the degraded high frequency SNR seen in conventional Sigma-Delta converters.

2

DESCRIPTION OF THE PREFERRED EMBODIMENTS

Figure 1:
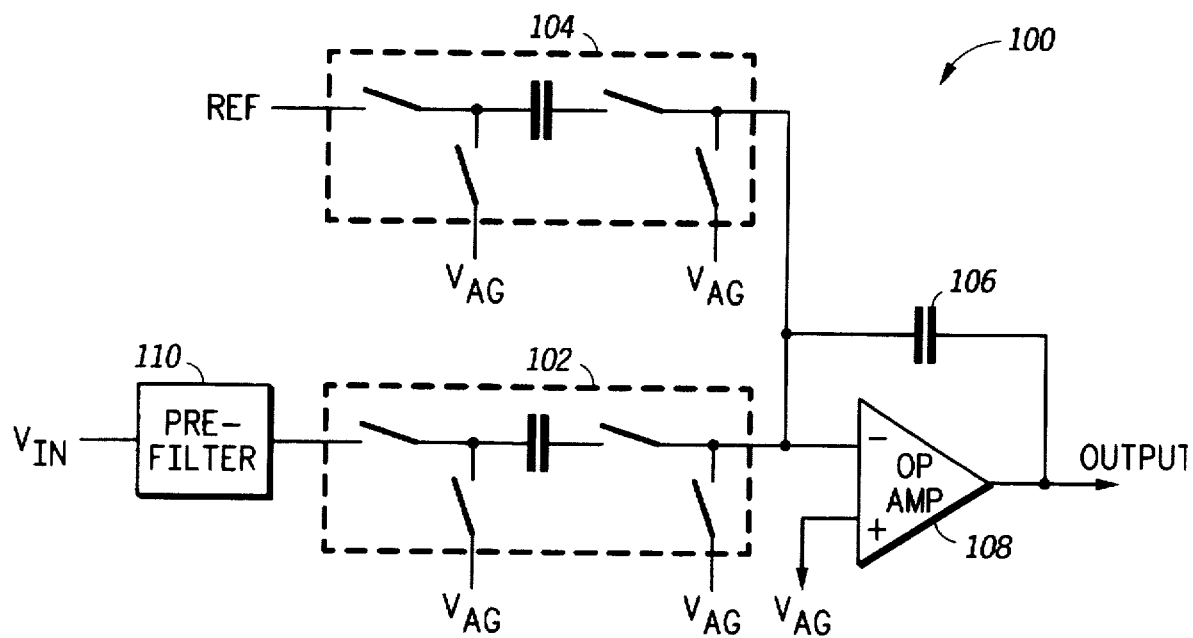
FIG. 1 shows a schematic diagram of an input stage for a conventional Sigma-Delta ADC.

The present invention provides an input stage (200) for use in a Sigma-Delta analog-to-digital converter (300) that utilizes a frequency independent impedance (202) in parallel with a frequency dependent impedance (210, 212). An analog input signal (Vin) is concurrently passed through both impedances to a terminal of an operational amplifier (208). A feedback reference (REF) from the A/D converter (316) is also coupled to the terminal of the op amp (208) via a second frequency independent impedance (204). The frequency dependent impedance (210, 212) enables amplification of the input signal at higher frequencies to boost signal-to-noise ratio at such frequencies. Thus, the frequency dependent impedance significantly improves signal-to-noise ratio in the Sigma-Delta converter, thereby avoiding any pre-filtering of the Sigma-Delta inputs.

With reference now to the figures, and in particular with reference to FIG. 1, there is shown a schematic diagram of an input stage for a conventional Sigma-Delta ADC. As will be appreciated by those skilled in the art, the conventional Sigma-Delta ADC typically includes two or more integrator stages connected in series to generate the digital modulated output. As will be further appreciated, FIG. 1 shows only the input or first stage of such a Sigma-Delta ADC.

Input stage 100 includes switched capacitors 102, 104, integrating capacitor 106, and operational amplifier (op amp) 108. The input stage's input ($V_{in}$) is coupled to pre-filter 110, which may degrade signal information at the input. The filtered output of pre-filter 110 is coupled to a switched capacitor 102, which, as is well understood by those skilled in the art, includes a sampling capacitor and a plurality of switches configured to charge and discharge the sampling capacitor at a sampling frequency. As known by those skilled in the art, there are multiple ways, including that shown in FIG. 1, to configure such a switched capacitor. The output of switched capacitor 102 is connected to the negative input of op amp 108, the positive terminal thereof being connected to analog ground ($V_{AG}$). A reference voltage (REF) is coupled to an input terminal of switched capacitor 104, and a second terminal of switched capacitor 104 is connected to the negative input of op amp 108. A first terminal of integrating capacitor 106 is connected to the negative terminal of op amp 108, and a second terminal of integrating capacitor 106 is connected to the output of op amp 108.

In operation, the input stage 100 generates an output proportional to the integrated difference between the input voltages $V_{in}$ and REF. In practice, the output of input stage 100 is coupled to the next stage of the Sigma-Delta ADC. As will be appreciated by those skilled in the art, the single-ended input stage shown in FIG. 1 can also be implemented in a differential manner.

Figure 2:
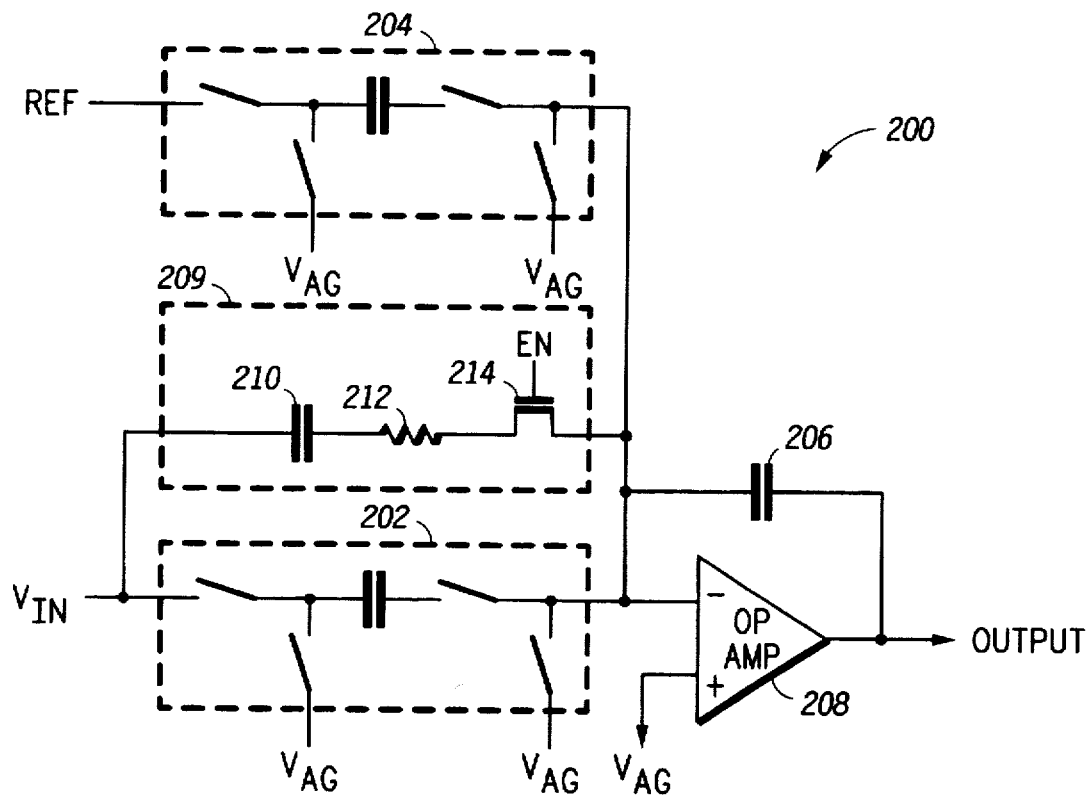
FIG. 2 an input stage 200 to a Sigma-Delta ADC, in accordance with the preferred embodiment of the present invention.

With reference now to FIG. 2, there is shown an input stage 200 to a Sigma-Delta ADC, in accordance with a preferred embodiment of the present invention. Input stage 200 includes a complex impedance circuit 209, in addition to a switched capacitor 202, and a switched capacitor 204 connected in parallel to the negative input (virtual ground) of op amp 208. The inputs of switched capacitor 202 and complex impedance circuit 209 are coupled to the input signal ($V_{IN}$). The reference voltage (REF) is coupled to an input terminal of switched capacitor 204. Integrating capacitor 206 is connected at one terminal to the output of op amp 208 and at a second terminal to the negative terminal of op amp 208. As shown in FIG. 2, the positive terminal of op amp 208 is connected to analog ground ($V_{AG}$). In an alternative embodiment of the present invention, the input stage for the Sigma-Delta ADC is configured as a differential input stage, where the circuitry shown connected to the negative terminal of op amp 208 is duplicated at the positive terminal of op amp 208 for receiving a differential input corresponding to $V_{in}$, as will be understood by those skilled in the art.

Complex impedance circuit 209 includes a shunt capacitor 210 connected in series with a resistor 212 and a transistor 214. The capacitor 210 and op amp 208 function together to amplify the high frequency content of the input signal $V_{IN}$, and the resistive device then limits the high frequency content above a desired signal band of the input stage. It will be appreciated that the order of series connection for the capacitor 210 and resistor 212 is equally interchangable. Also, resistor 212 can be formed using polysilicon, as a biased transistor, a switched capacitor, or using any other method known in the art for providing a resistive device. Transistor 214 acts as a switch for receiving an enable signal. The enable signal operates to enable or disable the complex impedance circuit 209 as necessary for particular applications. This enabling signal can be static or dynamic, such as when implemented with a two-phase clock.

In operation, input stage 200 generates an output proportional to the integrated difference between a function of the input voltage $V_{IN}$ and the voltage REF. Switched capacitor 202 samples the input signal and places the generated charge packets on the integrating capacitor 206. Similarly, switched capacitor 204 samples REF and places the generated charge packets on the integrating capacitor 206.

Figure 6:
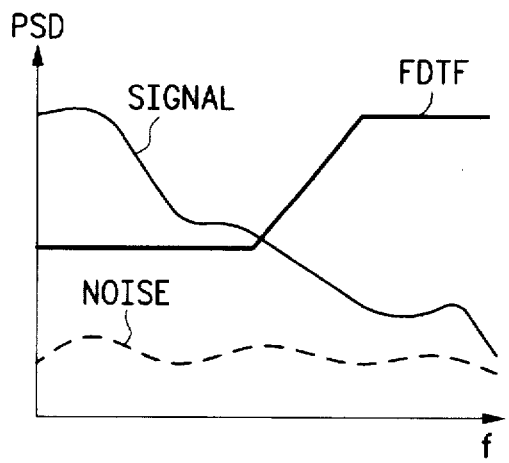
FIG. 6 shows the signal (SIGNAL) and noise (NOISE) components of the input signal, and the frequency domain transfer function (FDTF) of the input stage of a preferred embodiment of the present invention.
Figure 7:
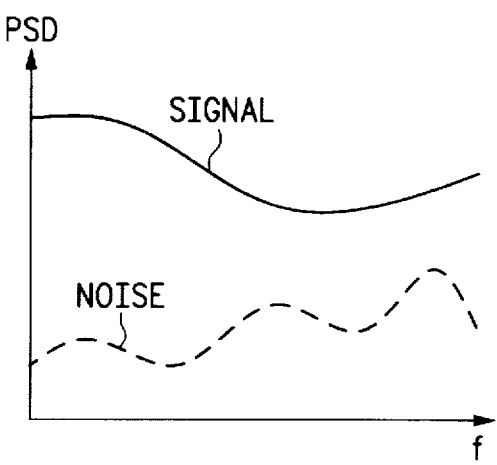
FIG. 7 illustrates the power spectral density output of a modulator in accordance with a preferred embodiment of the present invention.

Complex impedance circuit 209 generates a zero and a pole in the frequency response of input stage 200. Shunt capacitor 210 and the sampling capacitor of switched capacitor 202 operate in conjunction to produce the zero, and capacitor 210 and resistor 212 operate in conjunction to produce the pole. This zero-pole pair produce the frequency domain transfer function for providing a filtered output signal. FIG. 6 shows the signal (SIGNAL) and noise (NOISE) components of the input signal $V_{in}$ and the frequency domain transfer function (FDTF) of the input stage 200 provided by the embodiment of the present invention. As is shown in FIG. 2, the input stage 200 will filter the input signal $V_{in}$ through the FDTF to generate the filtered output of op amp 208 as shown in FIG. 7. As can be seen, the output of the Sigma-Delta ADC of the present invention has a substantially improved signal-to-noise ratio at the higher frequencies within the bandwidth of interest.

In some alternative embodiments of the present invention, additional complex impedance circuits (not shown), each having a series-connected capacitor, resistive element and a transistor switch, may be connected in parallel with complex impedance circuit 209. The complex impedance of each additional circuit is set to provide a different pole-zero pair. This enables adjustment of the FDTF for the input stage by switching in or out each of the complex impedance circuits. As will be appreciated, the use of multiple complex impedance circuit provides a programmable filter for the input stage of the Sigma-Delta ADC of the present invention.

Figure 3:
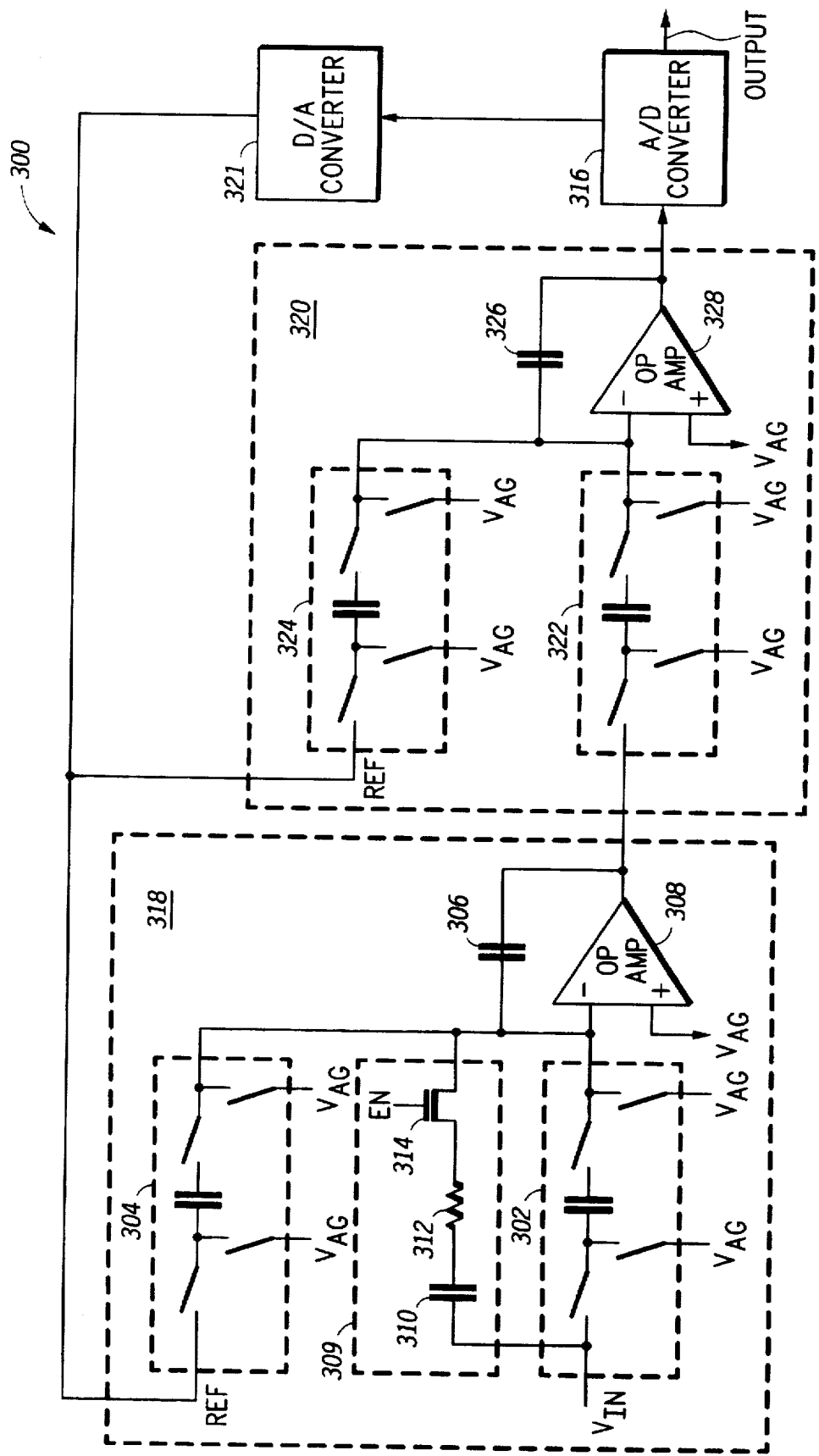
FIG. 3 shows a second order Sigma-Delta ADC having an improved input stage, in accordance with a preferred embodiment of the present invention.
Figure 4:
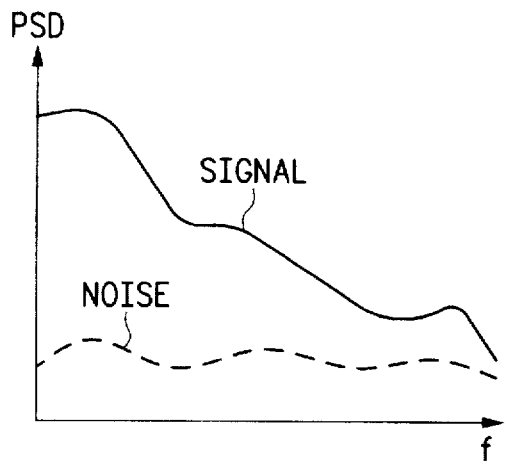
FIG. 4 illustrates a low pass power spectrum input to a Sigma-Delta converter.
Figure 5:
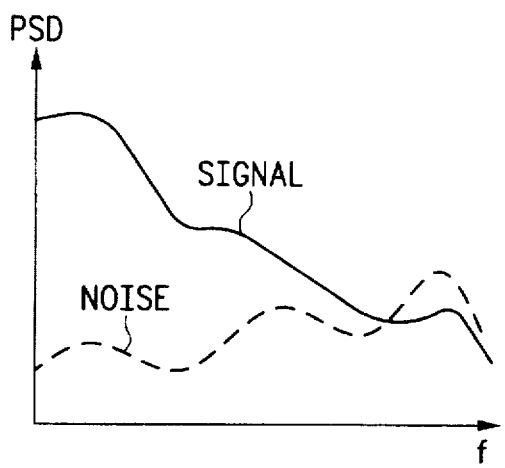
FIG. 5 illustrates the power spectral density output of a conventional modulator.

With reference now to FIG. 3, there is shown a Sigma-Delta ADC having an improved input stage, in accordance with a preferred embodiment of the present invention. The analog-to-digital converter 300 includes an input stage 318 and a second stage 320 connected in series to A/D converter 316. For illustration, FIG. 3 shows a two-stage Sigma-Delta ADC. As will be appreciated, the output of A-D converter 316 is input into a digital signal processor (not shown) to generate the digital output of the Sigma-Delta ADC. The modulator output generated at the output of A/D converter 316 is also input into D/A converter 321, which produces an analog output voltage that is coupled to both the input stage 318 and second stage 320 as the reference voltage (REF). Input stage 318 includes switched capacitors 302, 304, a complex impedance circuit 309, capacitor 306, and op amp 308 configured to operate as an input stage of a Sigma-Delta ADC of the present invention such as was described and shown in FIG. 2. Second stage 320 includes switched capacitors 322, 324, capacitor 326, and op amp 328 configured to operate as a second stage of a Sigma-Delta ADC, as will be appreciated by those skilled in the art. It will further be apparent to those skilled in the art that the present invention can be incorporated in a Sigma-Delta ADC of any order and that the invention is not intended to be limited to only a first or second order ADC. For example, a multi-stage Sigma-Delta ADC of the present invention could be formed by including one or more additional stages connected in series with second stage 320 and the input stage 318.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An input stage for an analog-to-digital converter, comprising:
    an amplifier having a first input and an output for providing a filtered output signal;
    a switched capacitor having an input for receiving an analog input signal to be converted into a digital equivalent signal, and having an output connected to the first input of the amplifier; and
    a capacitor connected in series with a substantially linear resistive device, the capacitor and substantially linear resistive device being coupled between the input of the switched capacitor and first input of the amplifier to place the capacitor and the resistive device electrically in parallel with the switched capacitor, the resistive device limiting high frequency content above a signal band of the input stage, and the capacitor and amplifier functioning to amplify high frequency content of the input signal.

2. The input stage of claim 1, wherein the capacitor has a first terminal directly connected to the input of the switched capacitor, and the substantially linear resistive device having a first terminal connected to a second terminal of the capacitor, and a second terminal coupled to the first input of the amplifier.

3. The input stage of claim 1 further comprising:
    an integrating capacitor having a first terminal connected to the output of the amplifier and a second terminal connected to the first input of the amplifier.

4. The input stage of claim 3 further comprising:
    a second switched capacitor having an input terminal for receiving a reference signal from the converter, and an output connected to the first input of the amplifier.

5. The input stage of claim 1 wherein the analog-to-digital converter is a Sigma-Delta converter.

6. The input stage of claim 5, wherein the Sigma-Delta converter further comprises:

a second stage having an input connected to the filtered output signal of the amplifier of the input stage, and having an output, the second stage further integrating the filtered output signal to provide an intermediate signal of the Sigma-Delta converter.

7. The input stage of claim 5, wherein the Sigma-Delta converter further comprises:
an internal analog-to-digital converter having a first input connected to the output of the second stage, a second input connected to a signal for comparison, and an output which provides the digital equivalent signal; and
a digital-to-analog converter having an input coupled to the output of the internal analog-to-digital converter, and an output for providing the reference signal.

8. The input stage of claim 1 further comprising:
a switch having a first terminal connected to the second terminal of the resistive device, a second terminal connected to the first input of the amplifier, and a control terminal for receiving an enable signal.

9. The input stage of claim 8 wherein the enable signal is a two-phase clock signal.

10. The input stage of claim 1 wherein the substantially linear resistive device is a resistor formed of polysilicon.

11. A method of optimizing signal-to-noise ratio in an input stage of a data converter, the method comprising the steps of:
sampling a first analog input voltage at an input terminal of the input stage and coupling the analog input voltage to an amplifier;
electrically coupling a complex impedance between the input terminal and the amplifier, the complex impedance modifying the frequency characteristic of an output of the data converter so that signal energy at high frequency is significantly amplified to increase signal-to-noise ratio at high frequency; and
coupling a second analog voltage to the amplifier synchronously and substantially concurrent with the sampling of the first analog input voltage.

12. The method of claim 11 wherein the analog-to-digital converter is a Sigma-Delta analog-to-digital converter and the step of coupling a second analog voltage further comprises coupling the second analog input voltage from an output of a stage of the Sigma-Delta analog-to-digital converter.

13. The method of claim 11 wherein the step of electrically coupling a complex impedance comprises switching the complex impedance between the input terminal and the amplifier with a transistor switch.

14. The method of claim 11 wherein the step of electrically coupling a complex impedance comprises directly connecting the complex impedance between the input terminal and the amplifier.

15. The method of claim 11 wherein the step of electrically coupling a complex impedance comprises coupling a capacitor in series with a resistor to form the complex impedance.

16. A method for providing frequency dependent gain in an input stage to an analog-to-digital converter, the method comprising the steps of:
coupling a first impedance between an input terminal and a virtual ground input node of an operational amplifier, the first impedance being substantially frequency independent over a predetermined signal bandwidth; and
coupling a second impedance between the input terminal and the virtual ground node to be concurrently electrically in parallel with the first impedance, the second impedance being frequency dependent;
wherein the frequency dependent gain of the input stage substantially increases when the second impedance has a smaller magnitude than the first impedance.

17. The method of claim 16 wherein the step of coupling the second impedance further comprises connecting a capacitor in series with a resistor between the input terminal and the virtual ground input node.

18. The method of claim 16 wherein the step of coupling the second impedance further comprises providing a switch between the virtual ground input node and the second impedance to selectively disconnect the second impedance from the virtual ground input node.

19. The method of claim 16 further comprising the step of:
coupling a third impedance to the virtual ground, the third impedance having a terminal for receiving an output signal from a stage of the analog-to-digital converter.

* * * * *